United States Patent [19]

Winter

[11] Patent Number: 4,564,805
[45] Date of Patent: Jan. 14, 1986

[54] OSCILLOSCOPE WITH INTEGRATED FREQUENCY COUNTER AND METHOD OF MEASURING FREQUENCY

[75] Inventor: Robert A. Winter, Sioux Falls, S. Dak.

[73] Assignee: Sencore, Inc., Sioux Falls, S. Dak.

[21] Appl. No.: 645,307

[22] Filed: Aug. 29, 1984

Related U.S. Application Data

[63] Continuation of Ser. No. 391,002, Jun. 23, 1982, abandoned.

[51] Int. Cl.⁴ .............................................. G01R 13/22
[52] U.S. Cl. ............................................... 324/121 R
[58] Field of Search .................... 324/121 R; 368/117, 368/115

[56] References Cited

U.S. PATENT DOCUMENTS 3,975,684  8/1976  Mordan ............................... 368/117
4,109,182  8/1978  Dalton ............................ 368/117 X
4,350,953  9/1982  Best et al. .................... 324/121 R X

OTHER PUBLICATIONS

Hewlett-Packard Catalog-Electronic Instruments and Systems, 1979.

Primary Examiner—Stewart J. Levy
Assistant Examiner—Stephen M. Baker
Attorney, Agent, or Firm—Edmond T. Patnaude

[57] ABSTRACT

The sweep trigger pulses generated internally in an oscilloscope are coupled to a pulse counter, which counter is reset periodically and a number proportional to the count accumulated during each period is displayed.

5 Claims, 2 Drawing Figures

OSCILLOSCOPE WITH INTEGRATED FREQUENCY COUNTER AND METHOD OF MEASURING FREQUENCY

This is a continuation of application Ser. No. 06/391,002 filed June 23, 1982 now abandoned.

The present invention relates in general to the art of measuring the frequency of a cyclical electric signal, and it relates more partucularly to a new and improved method and means for incorporating a frequency meter in an oscilloscope.

BACKGROUND OF THE INVENTION

Present day oscilloscopes commonly include an internal sweep trigger generating circuit which is driven by an input signal to produce a train of trigger pulses used to synchronize the sweep signal of the oscilloscope with the input signal. To enable synchronization of the sweep signal with complex input waveforms the internal trigger generating circuits include external manual controls for precisely selecting the portion of the input waveform which is sensed to initiate a trigger pulse. Inasmuch as the sweep signal is synchronized with the trigger pulses, these trigger controls can be precisely adjusted while viewing the display screen of the oscilloscope, and when they are thus adjusted, the sweep trigger pulses occur at the frequency of the input signal.

SUMMARY OF THE INVENTION

Briefly, there is provided in accordance with the present invention a combined oscilloscope and frequency counter, wherein the frequency counter counts the number of the internally generated sweep trigger pulses which occur in a predetermined period of time to measure the frequency of the input signal which drives the sweep trigger generating circuits.

In one embodiment of the invention a manual selector switch is provided for connecting a selected one of two AC input terminals to the sweep trigger generating circuits and the other input terminal to the input of another pulse generator which has preset parameters and generates a pulse for each cycle of relatively simple waveforms applied thereto. Another selector switch enables the operator to connect the pulses from either the sweep trigger pulse generator or from the preset pulse generator to the frequency counter.

Preferably, the sweep trigger pulse generating circuit includes manual controls which may be adjusted to select the portion of the input waveform which is sensed to produce the trigger pulses. The other pulse generator is not manually adjustable but is preset to sense a predetermined level and slope of the input signal waveform. Accordingly, with the oscilloscope synchronized with one input signal, the frequency of the other input signal may be quickly and easily measured without readjustment of the trigger controls, assuming that the other input signal is not a complex wave like, for example, a television video signal.

GENERAL DESCRIPTION OF THE DRAWINGS

The present invention will be better understood by a reading of the following detailed description taken in connection with the accompanying drawings wherein:

FIG. 1 is a view of the control panel of an oscilloscope and frequency meter embodying the present invention; and FIG. 2 is a block diagram of an electric circuit incorporated in the oscilloscope of FIG. 1.

DETAILED DESCRIPTION OF A PREFERRED EMBODIMENT OF THE INVENTION

Figure 1:
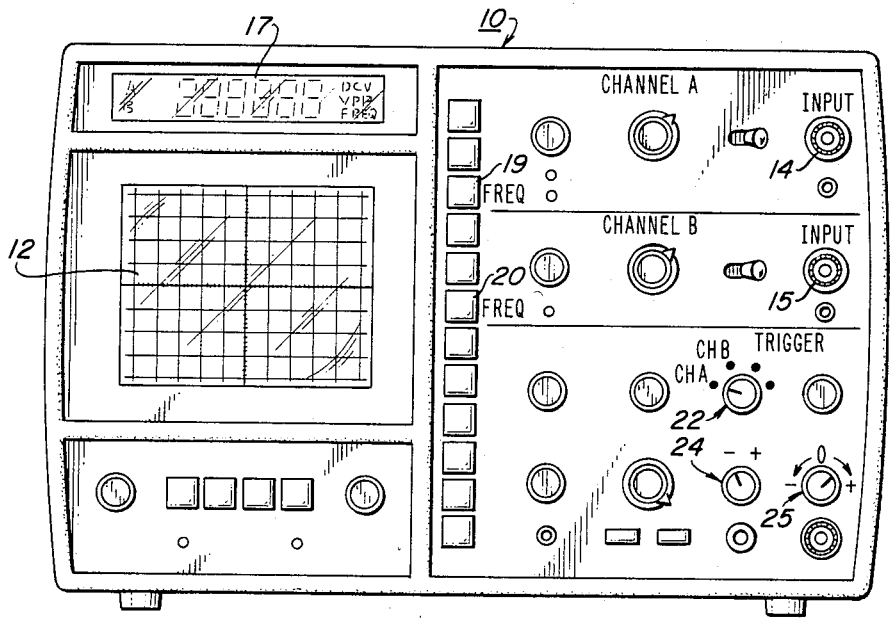

Referring to FIG. 1, an oscilloscope 10 may be seen to include a display screen 12 for providing visual images of one or more signals applied to coaxial input terminals 14 and 15. Terminal 14 is the channel A ac input terminal, and terminal 15 is the channel B ac input terminal. Located directly above the display screen 12 is a digital display 17 which in response to the actuation of a frequency selection switch actuator button 19 will display the frequency of the signal applied to the channel A input terminal 14 and which will display the frequency of the signal applied to the channel B input terminal 15 in response to the actuation of a frequency selection switch actuator button 20.

The oscilloscope is provided with an internal sweep trigger generator which can be used to synchronize the trace on the display screen 12 with either the channel A or channel B ac input signals applied to the terminals 14 and 15. As shown, a trigger source control switch 22 may be positioned in a channel A or channel B position wherein the sweep trigger generator circuits may be driven by a selected one of the channel A or B input signals. It will be understood that the switch 22 may also be used for synchronizing the sweep with other signals, but those other functions form no part of the present invention.

The oscilloscope 10 also includes a trigger polarity control switch 24 and a trigger level control 25. The controls 24 and 25 are incorporated into the sweep trigger pulse generator and are used to select the portion of the drive signal to which the trigger genrator responds. These controls permit synchronization of the oscilloscope with complex waveforms such, for example as television video signals.

Inspection of FIG. 1 will show many unidentified controls and input terminals. Inasmuch as these other controls and terminals do not form a part of the present invention neither they nor their functions are described herein. They are illustrated however, to provide a better understanding of how the present invention may be integrated into an oscilloscope type waveform analyzing instrument.

Figure 2:
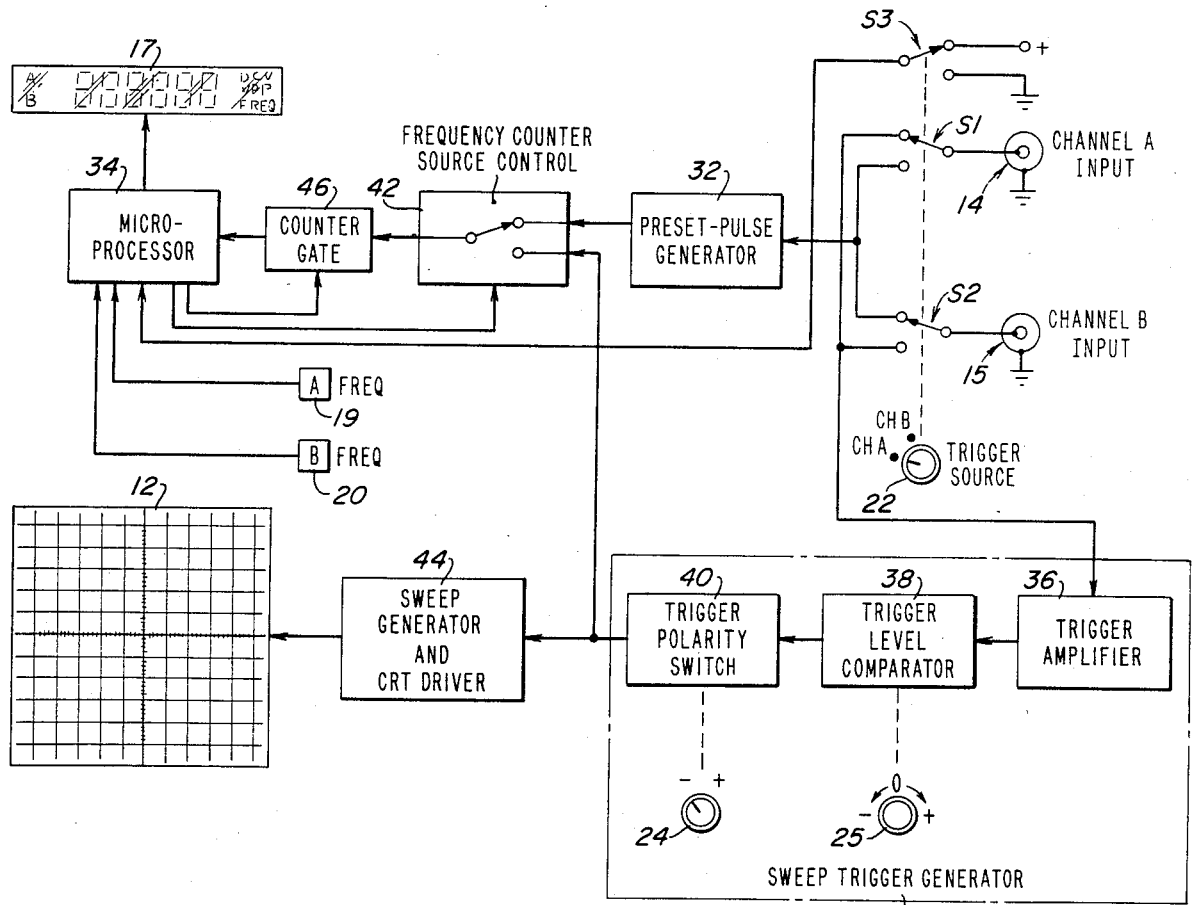

Referring to FIG. 2, the input terminals 14 and 15 are respectively connected to the common terminals of a pair of switches S1 and S2 which are ganged together for simultaneous actuation by the trigger source selector 22. It may be seen that with the source selector 22 in position A, the channel A input terminal 14 is connected by the switch S1 to the input of a sweep trigger pulse generator 30 and the channel B input terminal 15 is connected by the switch S2 to the input of a preset pulse generator 32. When the trigger source selector 22 is in the B position, the channel B input is connected to the input of the sweep trigger pulse generator 30 and the channel A input is connected to the input of the preset pulse generator.

A switch S3 is also actuated by the trigger source selector 22 and connects a high voltage to a microprocessor 34 when the trigger source selector is in the channel A position and connects a low voltage or ground to the microprocessor 34 when the trigger source selector is in the channel B position.

The sweep trigger generator 30 includes a trigger pulse amplifier 36 which drives a trigger level comparitor 38. The comparitor 38 compares the amplified input signal with the level selected by the level control 25 to provide an output when the amplitude of the input signal exceeds in absolute value the level set by the level control 25. The output of the comparitor 38 is coupled to a trigger polarity switch 40 which couples the comparitor output to a frequency counter source control switch 42 and a sweep generator and cathode ray tube horizontal sweep driver 44 only when the polarity of the comparitor output is the same as that selected by the trigger polarity control 24.

The trigger pulses from the switch 40 synchronize the sweep signal generated by the sweep generator 44 thereby to synchronize the trace on the display screen 12 of a cathode ray tube. It will be understood that other types of displays may be used in place of a cathode ray tube where it is practical and desirable to do so.

The output of the preset-pulse generator 32 is a train of pulses similar to the trigger pulses produced by the sweep trigger generator 30, and they are coupled to another input of the frequency counter source control switch 42. Unlike the sweep trigger generator, the level and polarity are preset in the preset-pulse generator 32. Consequently, while these parameters cannot be manually controlled for use with complex waveforms, the generator 32 will produce an output pulse for each cycle of the most frequently encountered waveforms such as sine waves, square waves, ramp waveforms and the like without the need for making any adjustments.

The switch 42 is controlled by the microprocessor 34 to couple either the sweep trigger pulses from the sweep trigger pulse generator 30 or the pulses from the preset-pulse generator 32 to a counter gate 46 which is reset by the microprocessor 34 after a predetermined time. The number of counts which occur during that predetermined time is totalized by the microprocessor and used to drive the digital display 17 which displays this total. The number displayed by the display 17 is, therefore, the frequency at which the pulses are applied to counter input of the microprocessor 34.

OPERATION

Assuming that two different AC signals are applied to the respective input terminals 14 and 15, the trigger source control may be set to synchronize the horizontal sweep waveform with either one of these input signals and the other one will be applied to the preset-pulse generator 32. With the source control in the illustrated position, the channel A input signal is applied to the sweep trigger pulse generator 30 and the controls 24 and 25 can be adjusted while viewing the waveform on the display screen 12 to precisely synchronize the sweep with the channel A input signal. When so adjusted, a trigger pulse will be produced for each cycle of the channel A input signal.

If the operator wishes to know the frequency of this channel A input signal, he simply pushes in the channel A frequency selector button 19 which causes the microprocessor 34 to control the switch 42 to couple the trigger pulses through the counter gate 46 to the counter input of the microprocessor 34. On the other hand, if the operator wishes to know the frequency of the channel B input signal he pushes the channel B frequency selector switch 20 to cause the microprocessor 34 to control the switch 42 to feed the pulses from the preset pulse generator 34 to the counter gate 46. If the channel B input signal is a complex wave, such, for example, as a television signal, it will be necessary to reposition the trigger source control 22 to the channel B position and then fine tune the trigger controls 24 and 25 with the aid of the waveform appearing on the display screen 12. Ordinarily, however, when the instrument 10 is being used in servicing electronic equipment, accurate frequency measurements can be made from the pulses generated by the preset-pulse generator 32.

It may be thus be seen that the present invention provides for the integration of a frequency meter into an oscilloscope having an internal sweep trigger generator. By counting the number of sweep trigger pulses which occur in a predetermined time, say 0.1 millisecond, the frequency of an AC input signal is measured. The time during which the count is made will depend on the scale being displayed where a multiple scale readout is used.

Precise adjustment of the trigger pulses by visual inspection of the display screen of the oscilloscope assures the occurrence of only one trigger pulse per cycle of the input signal and thus an accurate frequency measurement. The use of a preset-pulse generator enables the rapid and facile measurement of the frequency of most input signals without adjustment of the pulse generator parameters, i.e. the sync controls of the oscilloscope. Also, frequency measurements of two different input signals can be made without adjusting the sweep trigger controls of the oscilloscope.

While the present invention has been described in connection with a particular embodiment thereof, it will be understood by those skilled in the art that many changes and modifications may be made without departing from the true spirit and scope of the present invention. Therefore, it is intended by the appended claims to cover all such changes and modifications which come within the true spirit and scope of this invention.

What is claimed:

1. In an oscilloscope, the combination of
   a sweep trigger pulse generator for producing a train of trigger pulses in response to recurring conditions of an input signal applied thereto,
   said sweep trigger pulse generator including means for adjusting the polarity and level of the portion of said input signal with which said trigger pulses are synchronized,
   means responsive to said trigger pulses for synchronizing the sweep of said oscilloscope with said trigger pulses,
   frequency counter means for measuring the frequency at which pulses supplied to an input thereof occur,
   display means responsive to an output from said frequency counter for displaying a digital representation of said frequency,
   an auxiliary pulse generator for providing a train of auxiliary pulses in response to an input signal applied thereto, and
   switch means for selectively supplying either said train of trigger pulses or said train of auxiliary pulses to said input of said frequency counter means.

2. The combination according to claim 1 wherein said auxiliary pulse generator is responsive to preset level and slope polarity conditions of the input signal applied thereto.

3. The combination according to claim 2 wherein said oscilloscope comprises
   first and second input terminals, and manual selector switch means for coupling one of said input terminals to said sweep trigger pulse generator and the other of said input terminals to said auxiliary pulse generator.

4. The combination according to claim 1 comprising in combination means for displaying the waveform of said portion of said input signal with which said trigger pulses are synchronized.

5. A method of measuring the frequency of a cyclical recurring portion of the waveform of an input signal, comprising the steps of applying said input signal to a first input of a trigger pulse generator having adjustable slope and polarity controls, synchronizing the display on an oscilloscope with said trigger pulses generated by said trigger pulse generator, adjusting said controls while observing the waveform of said input signal on said oscilloscope to select the portion of said input signal in synchronism with which said generator generates said trigger pulses, applying said trigger pulses to a frequency counter to measure the frequency of said trigger pulses, and displaying a digital representation of the frequency at which said trigger pulses occur.

* * * * *